United States Patent [19]

Mollov et al.

[11] Patent Number: 5,644,271
[45] Date of Patent: Jul. 1, 1997

[54] TEMPERATURE COMPENSATED CLOCK

[75] Inventors: Ivan Petrov Mollov, Parkview; Robert Eugene Havens, Eldridge, both of Iowa

[73] Assignee: Mehta Tech, Inc., Eldridge, Iowa

[21] Appl. No.: 611,125

[22] Filed: Mar. 5, 1996

[51] Int. Cl.$^6$ .................. H03L 1/02; H03L 7/00; G04B 17/20
[52] U.S. Cl. .................. 331/176; 331/158; 327/160; 368/156; 368/201; 368/202
[58] Field of Search .................. 331/66, 68–70, 331/158, 176; 327/105–107, 160, 161; 368/11, 156, 159, 200–202

[56] References Cited

U.S. PATENT DOCUMENTS

| | | | |
|---|---|---|---|
| 3,978,650 | 9/1976 | Hashimoto et al. | 331/176 X |
| 4,325,036 | 4/1982 | Kuwabara | 331/176 |
| 4,443,116 | 4/1984 | Yoshida et al. | 331/176 X |
| 4,453,834 | 6/1984 | Suzuki et al. | 331/176 X |
| 4,684,897 | 8/1987 | Richards et al. | 331/176 X |
| 5,041,799 | 8/1991 | Pirez | 331/44 |
| 5,162,758 | 11/1992 | Onishi | 331/176 |
| 5,200,714 | 4/1993 | Hayashi | 331/66 |
| 5,204,975 | 4/1993 | Shigemori | 455/231 |
| 5,216,389 | 6/1993 | Carralero et al. | 331/18 |
| 5,281,874 | 1/1994 | Sorrells et al. | 307/606 |
| 5,365,130 | 11/1994 | Murray et al. | 327/278 |
| 5,392,005 | 2/1995 | Bortolini et al. | 331/44 |
| 5,420,895 | 5/1995 | Kim | 375/373 |
| 5,422,806 | 6/1995 | Chen et al. | 364/149 |
| 5,428,319 | 6/1995 | Marvin et al. | 331/176 |
| 5,459,436 | 10/1995 | Pucci et al. | 331/66 |
| 5,473,289 | 12/1995 | Ishizaki et al. | 331/176 |

*Primary Examiner*—David Mis
*Attorney, Agent, or Firm*—Woodard, Emhardt, Naughton, Moriarty & McNett

[57] ABSTRACT

A temperature compensation system includes a first oscillator to generate a number of pulses which vary from a desired frequency as a function of temperature of the first oscillator. The system also includes a second oscillator to generate digital pulses at a corrective frequency which is greater than the desired frequency. A sensor provides an temperature signal for the first oscillator. A digital memory has a digital error table addressable by a signal corresponding to the temperature signal to provide a number of pulse errors corresponding to temperature error for each of the number of pulses. Each pulse error is a function of the corrective frequency and a temperature versus frequency characteristic of the first oscillator. An accumulator receives each pulse error to generate a cumulative error corresponding to one of the number of pulses. A variable delay device counts a quantity of corrective pulses from second oscillator to provide a delayed output pulse in accordance with the desired frequency. The quantity of corrective pulses is a function of the cumulative error signal received from the accumulator. The converter, memory, accumulator and delay device may be part of a microcontroller.

27 Claims, 5 Drawing Sheets

TEMPERATURE COMPENSATED CLOCK

BACKGROUND

The present invention relates to temperature compensation of time sources, and more particularly relates to compensation of digital clocks.

The frequency source for many clock configurations changes with temperature. This phenomenon can be problematic when an accurate time source is desired. The problem is particularly acute for clock sources based on a piezoelectric crystal. Piezoelectric crystals usually exhibit a nonlinear temperature versus frequency characteristic as disclosed in U.S. Pat. No. 5,200,714 to Hayashi for an AT cut piezoelectric quartz frequency source. U.S. Pat. No. 5,041,799 to Pirez discloses similar nonlinear curves for an AT cut crystal configured for use in an oscillator. In addition, the frequency response of piezoelectric crystals has been known to change with age of the crystal.

One solution to this problem has been to place the crystal and other temperature sensitive components of a crystal-based frequency source in an oven. Typically, the oven maintains a temperature corresponding to a zero slope region of the temperature versus frequency curve for the selected crystal configuration. Unfortunately, this kind of compensation system is usually quite expensive. Also, the space and energy required for an oven may make this approach impractical.

Other attempted solutions include adjustments to the load reactance of a crystal-based oscillator circuit to compensate for changes with temperature and age. These systems often involve a varactor to adjust oscillator load reactance. U.S. Pat. Nos. 5,428,319 to Marvin et al., 5,204,975 to Shigemori, 5,162,758 to Onishi, and 4,302,731 to Ashida disclose various schemes to improve oscillator performance through adjustment of load reactance. The degree of compensation possible for this type of system is generally limited by the initial quality of the crystal and may not be cost effective for some applications. Furthermore, this approach may not be satisfactory for low frequency applications requiring a very high degree of precision.

Thus, there remains a need for a clock compensation system with improved efficiency which may be used to provide a highly precise low frequency time source. Preferably, this need may be satisfied without relying on an oven or control of oscillator load reactance.

SUMMARY OF THE INVENTION

One aspect of the present invention is compensating for the frequency drift of a time source by utilization of a variable time delay device. The output from the time source is compensated by dynamically delaying it an amount corresponding to a target output. With this approach, it is generally not necessary to adjust oscillator circuit load reactance or supply an oven to provide adequate time source compensation.

Another aspect of the present invention is providing a temperature compensation system that includes two oscillators with a delay device. Either of these oscillators may be based on a crystal frequency source. The first oscillator generates a number of pulses which vary from a desired frequency as a function of temperature. The second oscillator generates pulses at a corrective frequency greater than the desired frequency. A temperature sensor provides a temperature signal corresponding to temperature of the first oscillator. An error table provides a number of pulse error signals corresponding to temperature error for each of the number of pulses from the first oscillator. Each of the number of pulse error signals is a function of the corrective frequency and a temperature versus frequency characteristic of the first oscillator. An accumulator receives each of the pulse error signals to provide a cumulative error signal corresponding to one of the number of pulses from the first oscillator. A variable delay device is coupled to the accumulator, first oscillator, and second oscillator. The variable delay device counts a quantity of corrective pulses from the second oscillator in response to the pulse for which the cumulative error signal was generated to provide a delayed output pulse in accordance with the desired frequency. The quantity of corrective pulses is a function of the cumulative error signal received from the accumulator.

One variation of this temperature compensation system is loading the error table in a digital memory, and providing a digital accumulator and digital variable delay device. Also, an analog to digital converter is coupled to a sensor to provide a corresponding digital temperature error address signal for each of a number of erroneous pulses. In a further variation, the converter, memory, accumulator, and delay device may be part of a microcontroller integrated circuit.

Accordingly, one object of the present invention is to provide a temperature compensated time source using a variable delay device.

Another object of the present invention is to provide a cost effective temperature compensation system which utilizes at least two oscillators of differing frequencies.

Still another object of the present invention is to provide a digitally compensated clock which includes a digital variable delay device and multiple oscillators which may be microcontroller or microprocessor based.

Further objects, features, and advantages of the present invention will become apparent from the details and drawings contained herein.

DESCRIPTION OF THE PREFERRED EMBODIMENT

Figure 1:
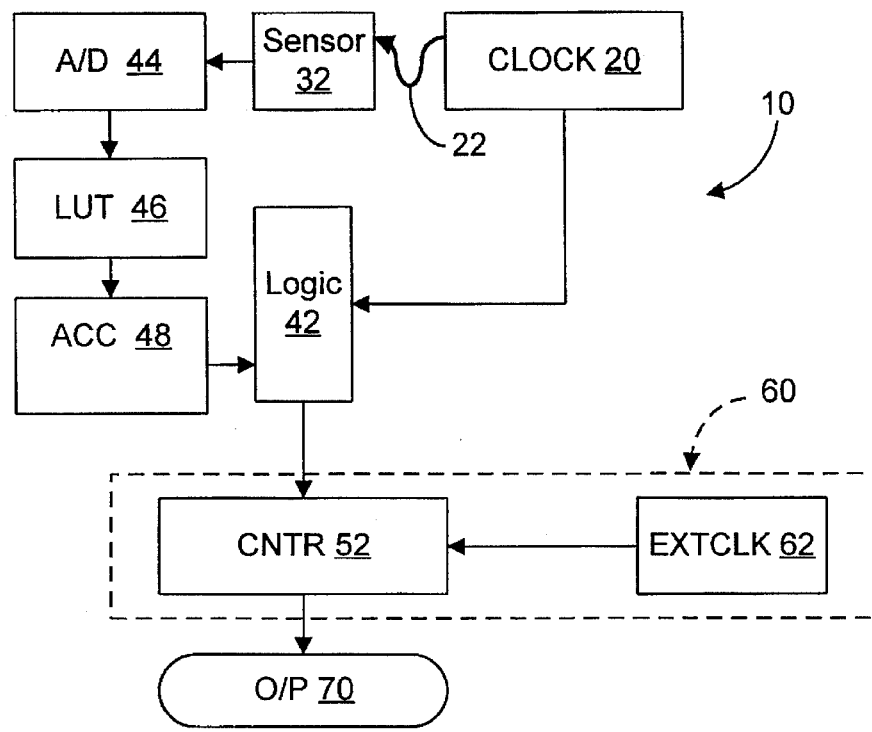
FIG. 1 is a block diagram illustrating one preferred embodiment of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended. Any alterations and modifications of the illustrated invention, and any further applications of the principles of the invention as illustrated therein being contemplated as would occur to one skilled in the art to which the invention relates.

Figure 2:
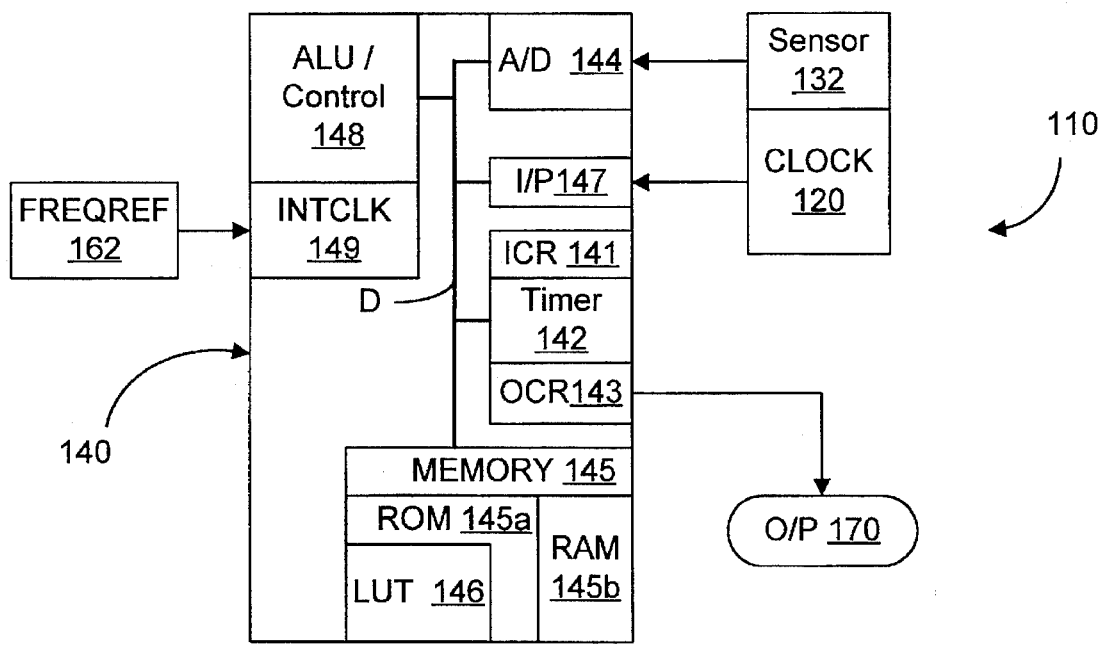
FIG. 2 is a schematic diagram illustrating an alternative preferred embodiment of the present invention.

FIGS. 1 & 2 show two preferred embodiments of the present invention. Following a separate introductory description of each of these embodiments, operation of both embodiments is described concurrently. Turning to FIG. 1, a compensation system 10 of the present invention is depicted. System 10 includes a clock 20. Clock 20 may be an oscillator with a piezoelectric crystal frequency source and appropriate circuitry. Preferably clock 20 provides a square wave output of the type commonly used in digital electronic applications; however, other output formats are also envisioned. The output signal of clock 20 is provided as an input signal to control logic 42.

System 10 also has a temperature sensor 32 thermally coupled to clock 20 as schematically represented by arrow 22. Temperature sensor 32 monitors the temperature of clock 20 and may be bonded thereto. For one embodiment having a crystal frequency source, temperature sensor 32 is bonded directly to a crystal frequency source. Temperature sensor 32 may be of a thermistor variety, or may be of another conventional type. Preferably, temperature sensor 32 is a 10,000 Ω thermistor.

Temperature sensor 32 is electrically coupled to Analog to Digital (A/D) converter 44. A/D converter 44 is of a conventional type which converts an analog electrical characteristic from temperature sensor 32 into a digital signal indicative of the temperature of clock 20.

Look-Up Table (LUT) 46 is electrically coupled to A/D converter 44. LUT 46 contains data corresponding to the temperature v. frequency characteristic of clock 20. Specifically, for a given temperature of clock 20, LUT 46 provides a value relating to the deviation of clock 20 from a target or ideal freqeuncy. In one embodiment, this value is in terms of pulse period error expected at the given temperature. The pulse period error is a measure of the deviation of pulses from clock 20 with respect to an ideal period corresponding to the target frequency. Preferably, LUT 46 is provided by one or more electronic memory components; however, other media such as magnetic or optical devices may alternatively be utilized in connection with LUT 46. In system 10, the digital signal provided by A/D converter 44 is used to address LUT 46 to obtain a corresponding pulse error signal for the temperature sensed with temperature sensor 32 for each successive pulse generated by clock 20.

In one embodiment, LUT 46 is preloaded with pulse error values corresponding to a selected temperature range as a function of the temperature versus frequency curve of clock 20. In this embodiment, a temperature within the given range is provided as an input to LUT 46 to generate a corresponding pulse period deviation expected for clock 20 when at the input temperature.

Accumulator (ACC) 48 is electrically coupled to LUT 46 to receive pulse error values for each pulse of clock 20. ACC 48 is coupled to control logic 42. Control logic 42 is in turn coupled to variable delay device 60.

Variable delay device 60 includes a counter 52 and an external clock (EXTCLK) 62. Variable delay device 60 is of a known type which may be analog or digital. For the embodiment of system 10, variable delay device 60 is digital. U.S. Pat. Nos. 5,420,895 to Kim and 5,365,130 to Murry et al. discuss certain variable delay devices.

EXTCLK 62 is of a known configuration. It may be a crystal-based oscillator of a known design. EXTCLK 62 is selected to have a frequency greater than the frequency of clock 20 and the target or desired frequency output by system 10 after compensation. Generally, it is preferred that EXTCLK 62 have a frequency at least 1000 (three orders of magnitude) greater than the target frequency of clock 20. It is more preferred that EXTCLK 62 have a frequency of at least 100,000 (five orders of magnitude) greater than clock 20. It is most preferred that EXTCLK 62 have a frequency of at least 1,000,000 (six orders of magnitude greater than clock 20). Generally, clock 20 is selected to have a frequency closer to the target frequency than EXTCLK 62.

Counter 52 is preferably of a digital variety configured to accept a value from ACC 48 via control logic 42 and count down to zero at which time it generates an output signal. In one embodiment, this count down is triggered by a pulse from clock 20 via control logic 42. This pulse from clock 20 relates to an amount of cumulative clock 20 error loaded into counter 52 from ACC 48. This cumulative error corresponds to the triggering pulse in such a way that the output signal from counter 52 compensates to some degree for the temperature deviation of clock 20. Output device (O/P device) 70 is used to provide a desired pulse shape for the output signal from counter 52. Alternatively, the output signal from counter 52 may be used to supply the compensated output pulse of system 10. In one embodiment, the frequency of clock 20 is 1 Hz with an error of 50 ppm and the frequency of EXTCLK 62 is 1 MHz with an error of 50 ppm. For this embodiment, counter 52 may be utilized to provide compensated output pulses at 1 Hz with an error of about 1 ppm. In a variation of this embodiment, the 1 Hz output of counter 52 is used by O/P device 70 to generate 1 Hz pulses with about a 16 millisecond width for each one. Further details concerning the operation of system 10 are provided in connection with FIGS. 2–5.

FIG. 2 illustrates compensation system 110. System 110 includes clock 120 which is preferably a digital clock with a square wave output and generally similar to clock 20 of FIG. 1; however, other output formats of clock 120 are also envisioned. Sensor 132 is shown connected to clock 120 and is generally the same as sensor 32 of system 10.

Controller 140 has an A/D converter 144 which is electrically coupled to sensor 132 to supply a digital signal indicative of temperature. A/D converter 144 is coupled to internal bus D of controller 140. Bus D also operatively connects timer 142, memory 145, discrete input (I/P) 147, and ALU/Control 148 together.

Timer 142 is generally free running and "rolls over" periodically. Timer 142 includes Input Capture Register (ICR) 141 to capture the value of timer 142 for use by the ALU/Controller 148 without altering the count of timer 142. Output Comparison Register (OCR) 143 of timer 142 is used to provide a comparison value. When a value is loaded in OCR 143, typically an output (O/P) signal is generated when the contents of OCR 143 and the value of timer 142 are equal. The O/P signal of OCR 143 may be used to directly provide compensated output pulses for system 110 or may be further processed with O/P device 170.

Memory 145 includes Read Only Memory (ROM) 145a which may be of the fuse link, Erasable Programmable Read Only Memory (EPROM), Electrically Erasable Programmable Read Only Memory (EEPROM), or such other type as would occur to one skilled in the art. Memory 145 also has Random Access Memory (RAM) 145b which may be of the static, dynamic, or such other type as would occur to one skilled in the art. ROM 145a includes a Look-Up Table (LUT) 146. LUT 146 is configured similar to LUT 46 of system 10 to provide error values as a function of the temperature versus frequency characteristic of clock 120.

Frequency reference (FREQREF) 162, which preferably is a piezoelectric crystal, is operably coupled to controller 140. In turn, controller 140 produces a corresponding internal clock signal (INTCLK 149) as a function of FREQREF 162 to synchronize various operations. Like EXTCLK 62 of system 10, INTCLK 149 is selected to have a frequency greater than the target frequency and the frequency of clock 120. Timer 142 is incremented or "counts" as a function of INTCLK 149.

Each LUT 46, 146 includes values corresponding to the temperature versus frequency characteristic for each clock 20, 120, respectively, over a predetermined temperature range. For LUT 46, these deviations are stored as a function of the frequency of EXTCLK 62. Specifically, the pulse period error for clock 20 is quantified as a number of pulses from EXTCLK 62 closely approximating the period deviation from the ideal. Similarly, LUT 146 characterizes clock 120 pulse period deviations from the ideal period T in terms of a quantity of pulses from INTCLK 149. Besides pulse counts, values of LUT 46 or 146 may be entered which are the result of a different function of the frequency of EXTCLK 62 or INTCLK 149, respectively, as would occur to one skilled in the art. In fact, more than two clocks of differing frequency may be used in other embodiments.

Figure 3A:
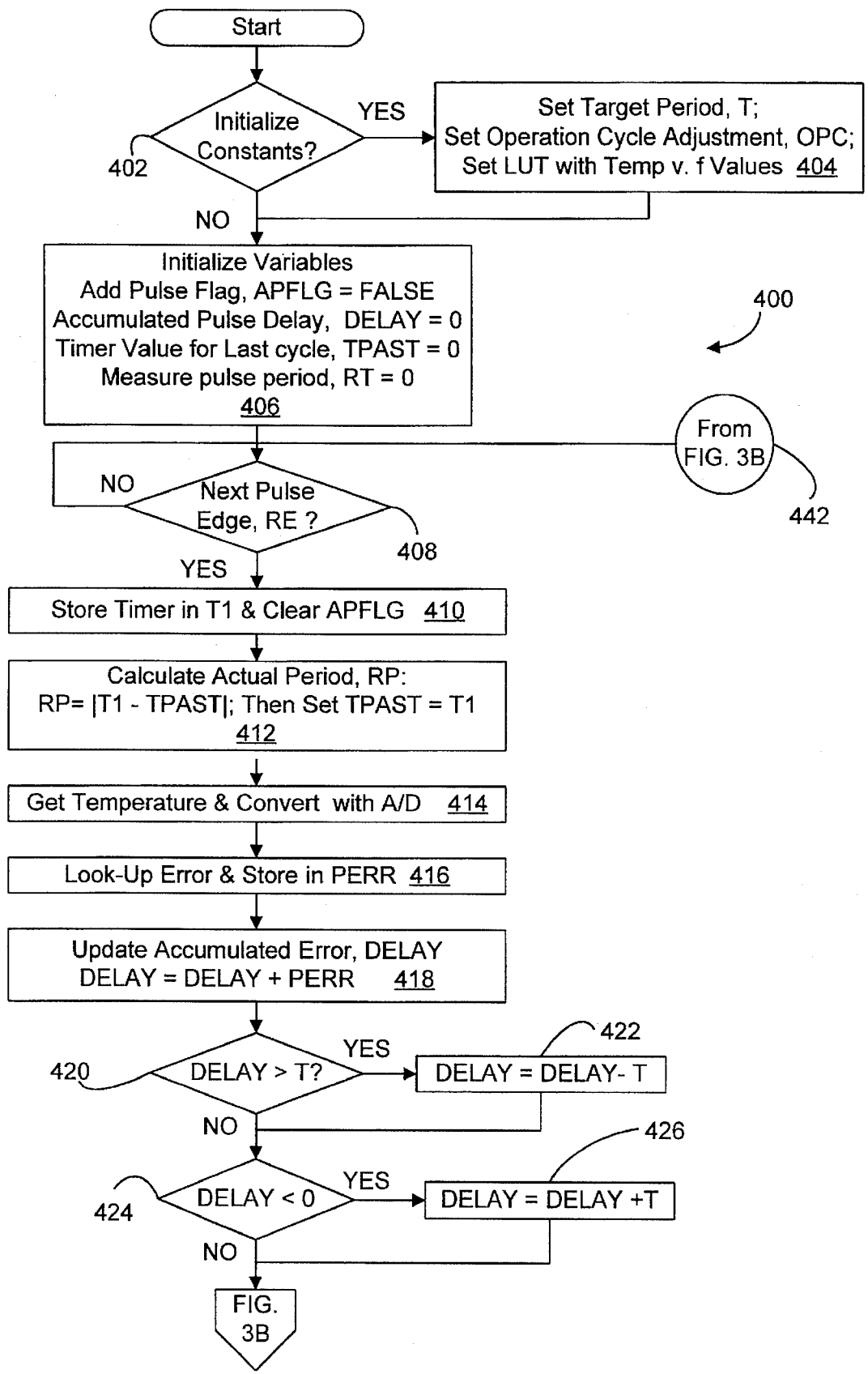
FIG. 3A is a now chart of a routine for execution by the embodiment shown in FIG. 2.

Next, selected operations of the embodiments of FIGS. 1 & 2 are discussed in connection with routine 400 shown in FIGS. 3A & 3B. Routine 400 is particularly described in connection with a programmable version of controller 140 included in system 110, but a comparable mode of operation of system 10 is likewise discussed.

Conditional 402 of routine 400 determines whether there is a need to initialize certain program constants. If there is a need, control flows to step 404. In step 404, The target period T corresponding to an ideal or desired output frequency for compensation system 110 is set. For system 10, this value may be included as part of control logic 42. Variable OPC is an adjustment constant determined as a function of the amount of time it takes for controller 140 to perform a certain sequence.

Also in step 404, a procedure to fill LUT 146 is provided. In one embodiment of this procedure, LUT 146 is filled empirically by holding clock 120 at a constant temperature for a predetermined duration of time and assigning a number of pulses from INTCLK 149 corresponding to the deviation of the period of clock 120 at that temperature. Preferably, this duration is a multiple of T. When a multiple of T is used, the resulting error of clock 120 may be determined by dividing the number of pulses by the corresponding multiple of T to provide an averaged LUT 146 entry. This procedure is repeated for selected temperatures over a selected range. By using a multiple of T, the resolution of each entry may be improved. Preferably, at least a multiple of 4 is used. More preferably, at least a multiple of 8 is used. Most preferably, at least a multiple of 16 is used. The initialization conditional 402 may be selectively or automatically triggered. In one embodiment, a discrete switch is provided to selectively recalibrate system 110 to account for drift of clock 120 with age.

LUT 46 may be filled in a similar customized fashion or may be preprogrammed from a known temperature versus frequency characteristic available for the configuration of clock 20 when a table customized to a particular clock 20 device is not needed.

Next control flows to step 406 to initialize program variables. The control flag APFLG is set to false and variables DELAY, TPAST, and RT are set to an initial value of 0. These variables are described further in connection with other steps of routine 400.

Next control flows to conditional 408. This conditional waits until a positive edge of a pulse from clock 120 (RE) is detected at I/P 147. Routine 400 is configured to idle at conditional 408 until an RE is detected. This idle loop is nested within a larger loop of routine 400. This larger loop, alternatively designated the "compensation loop" of routine 400, begins with conditional 408, follows various execution paths corresponding to reference numerals in the 410 to 440 range, and then "loops back" to conditional 408 via connector 442. Exit from the compensation loop may be accomplished by an interrupt routine or by using an exit flag within the loop (not shown). Also, when controller 140 is powered under the selective control of an operator, the loop may be exited by removing power.

Once an RE is detected, control flows to step 410. In step 410, the value of timer 142 is captured in ICR 141 as T1 and APFLG is cleared if previously set. In step 412, the real period (RP) between the detected RE and the most recent previously detected RE of clock 120 is determined and stored, where: RP=|T1−TPAST|. TPAST is the value of timer 142 corresponding to the most recent previous RE. If this is the first detected pulse, then the assignment of RP is ignored. In either case, step 412 concludes by updating TPAST with T1. The RP value and T are used in connection with subsequent pulse adjustment steps of routine 400. A similar procedure may be implemented in system 10 using control logic 42.

The temperature of clock 120 is sampled and digitized in step 414 using sensor 132 and A/D converter 144. System 10 comparably uses temperature sensor 32 and A/D converter 44 to provide a digitized temperature. Step 416 uses the converted value from step 414 as a temperature error address signal corresponding to the RE detected in step 408 to obtain a corresponding pulse error value (PERR) from LUT 146 as approximated by a count of pulses at the frequency of INTCLK 149. A comparable step may be performed with LUT 46 to determine error of a pulse from clock 20.

Next, PERR is added to a tally of successive previous PERRs in variable DELAY in step 418 (DELAY=DELAY+ PERR). Notably, PERR may be positive or negative. Specifically, if an RP is less than T, then the corresponding PERR is positive. Conversely, if RP is greater than T, the corresponding PERR is negative. PERR will be zero for a given pulse when no error results for the given clock 20 temperature. Next control flows to conditional 420 to determine if DELAY exceeds T. If DELAY is greater than T, then T is subtracted in step 422 causing DELAY to "rollover" to a residual value. If, as tested in the next conditional 424, DELAY is negative, then T is added to DELAY in step 426. As a result of steps 420–426, DELAY is maintained in a range from 0 through T.

Figure 4:
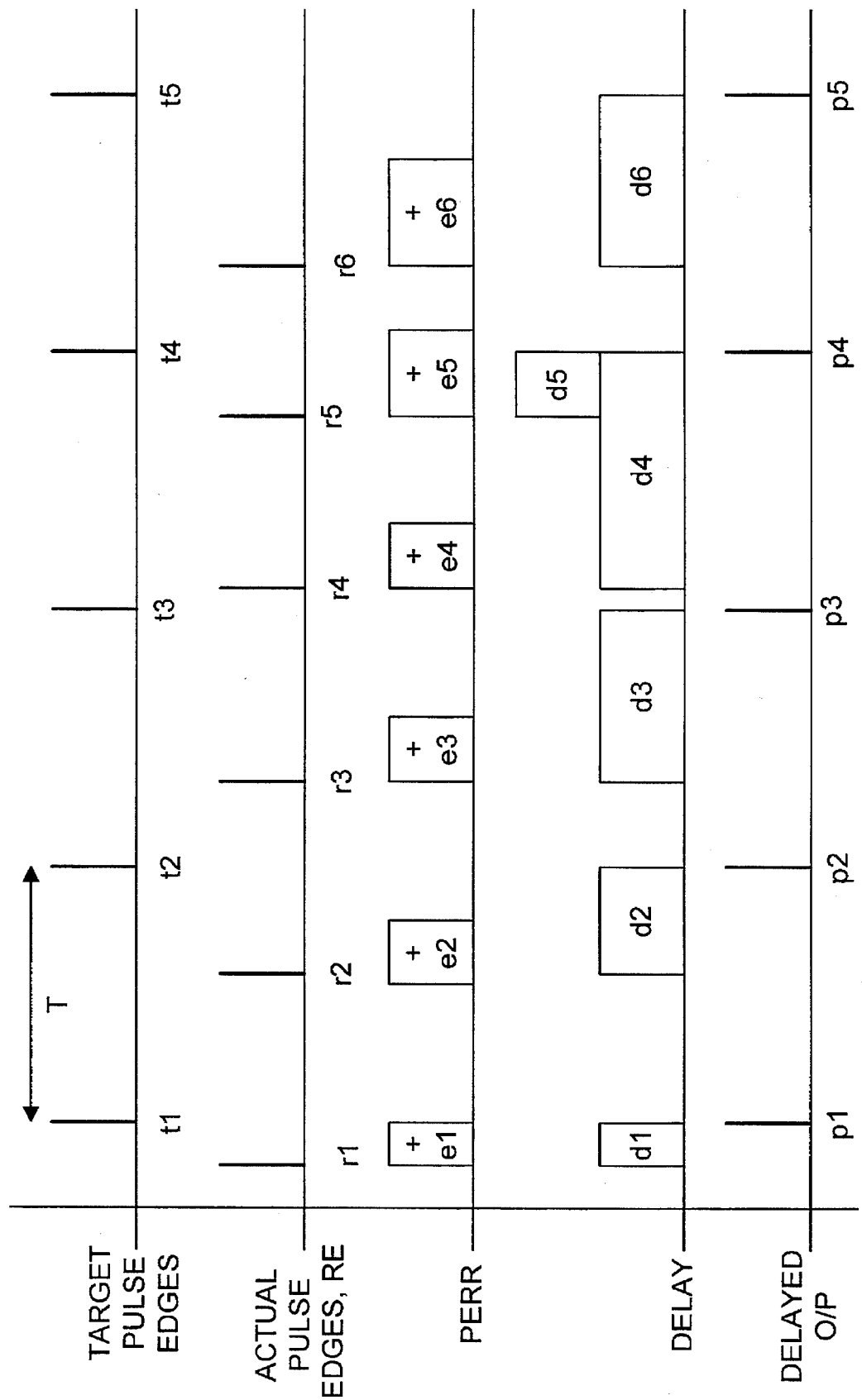
FIG. 4 is a first timing diagram illustrating selected aspects of the routine shown in FIGS. 3A & 3B.

Referring additionally to the timing diagram of FIG. 4, the consequence of several successive executions of the compensation loop of routine 400 is illustrated Such successive executions correspond to the successive detection of a number of REs from clock 120. In FIG. 4 pulse edges t1 through t5 correspond to the ideal or target pulse edges desired to be provided with compensation system 110. The period T is illustrated by a double headed arrow situated between edges t1 and t2. On the other hand, a number of actual pulse edges (REs) individually indicated as r1 through r6, are shown out of synchronization with target pulses t1 through t5 as may result from temperature drift. Corresponding values of PERR (from LUT 146) for each RE, r1 through r6, are shown as e1 through e6. Each PERR shown in FIG. 4 is positive under the previously discussed convention. Similarly, DELAY is shown as it accumulates for successive executions of the compensation loop, where: d1=e1, d2 =d1+e2, d3=d2+e3, d4=d3+e3, etc. As a consequence, DELAY is a measure of cumulative error of pulses from clock 120 provided as a function of the INTCLK 149 frequency. DELAY is accumulated in ALU/Control 148. For system 10, ACC 48 accumulates the delay.

Figure 3B:
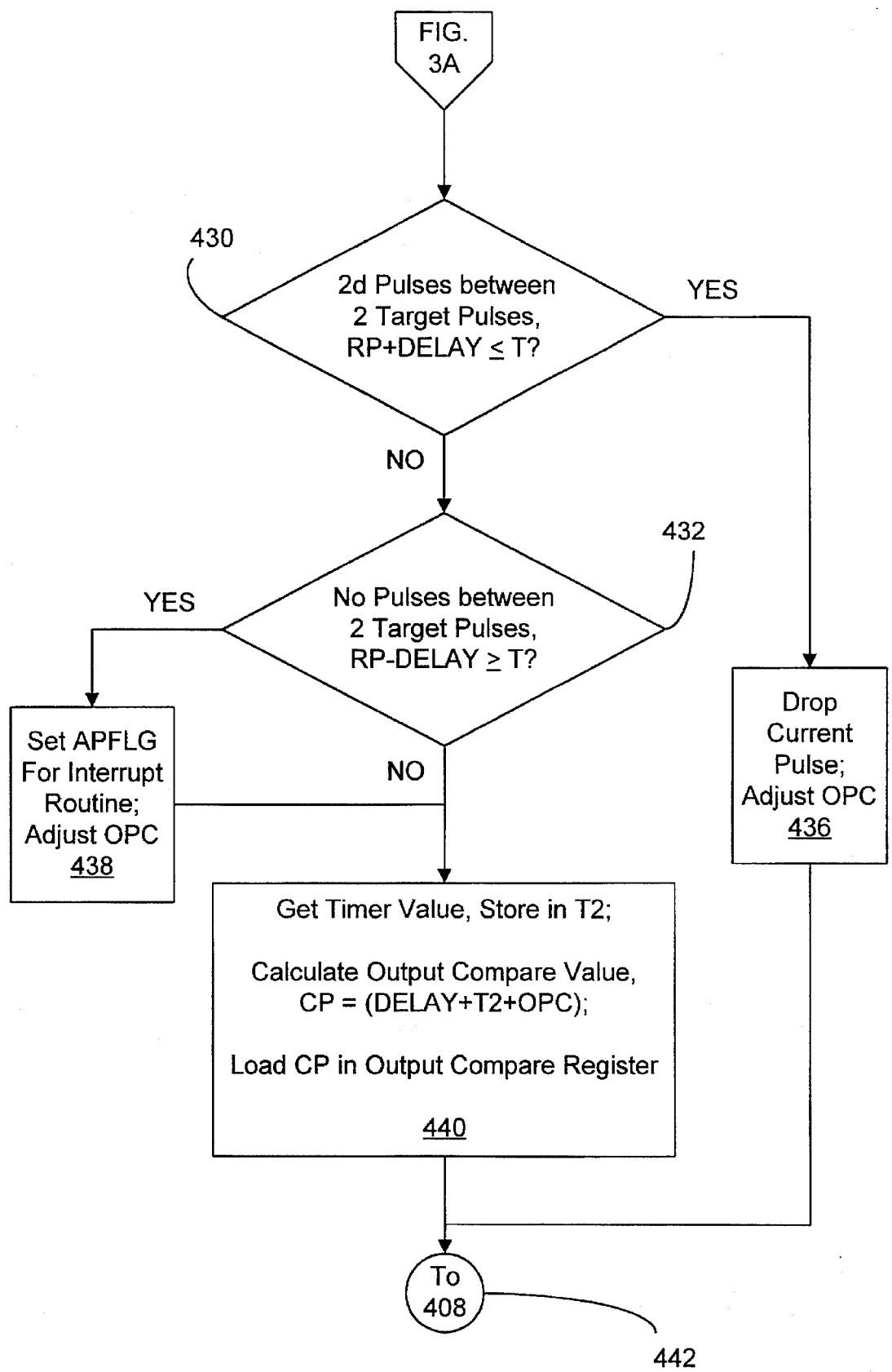
FIG. 3B is a continuation of the flow chart shown in FIG. 3A.

Assuming that neither conditional 430 or 432 of FIG. 3B is satisfied, then control flows to step 440. In step 440, the value of timer 142 is retrieved via ICR 141 as variable T2. T2 is added to DELAY. Also, OPC, expressed in terms of a quantity of INTCLK 149 cycles, is added in accordance with the corresponding expression: CP=DELAY+T2+OPC. CP is then loaded in OCR 143. When the value of timer 142 equals CP, an output is generated by OCR 143. Notably, T2 is added to normalize CP to the current value of timer 142, typically resulting in OCR 143=the value of timer 142 after timer 142 counts DELAY+OPC number of INTCLK 149 pulses.

Referring again to FIG. 4, it should be noted that each delay d1, d2, d3 correspondingly bridge the horizontal gap between r1 and p1, r2 and p2, and r3 and p3. In effect, the pulses r1, r2, r3 are offset by the amounts d1, d2, d3 as a function of the frequency of INTCLK 149 and the temperature versus frequency. characteristic of clock 120. For r1 through r3, the associated values, d1 through d3, each correspond to the amount of time each lags a target pulse, t1 through t3. Thus, each RE, r1 through r3, may be used to trigger the corresponding delay, d1 through d3, to provide a corresponding compensated output pulse edge, p1 through p3 which generally coincide with target pulse edges t1 through t3. This dynamic delay of REs is one feature of the present invention which contributes to the compensated output O/P signal of system 110. Notably, it is not necessary that the second clock have better performance characteristics than the first clock, although a second clock with better performance characteristics may be used.

It is recognized that pulses p1 through p3 generated in accordance with the present invention may still deviate to some extent from the target pulses, t1 through t3. This variation is expected to be a function of a number of factors such as the difference in frequency between clock 120 and INTCLK 149, the amount of error inherent in pulses generated by clock 120 and INTCLK 149, and the resolution of values loaded in LUT 146. However, these and other factors may generally be controlled to provide a desirable degree of compensation.

System 10 is comparably configured to accumulate delay in ACC 48 for counter 52 to dynamically delay corresponding pulses from clock 20. In both cases, O/P devices 70, 170 are used to provide a desired compensated pulse format from the output signals of counter 52, and OCR 143, respectively, using techniques known to those skilled in the art. In other embodiments the compensated pulse output signal (O/P) is provided by counter 52, OCR 143 directly.

Returning to FIG. 3B, consider the case when conditional 430 is satisfied. In this case two pulses from clock 120 are within two target pulses. To test for this condition, the current DELAY plus the current period for the most recent clock 120 pulse edges must be less than the ideal period, which is expressed as: RP+DELAY≦T. In FIG. 4 this situation arises for pulses r4 and r5 which are both within target pulses t3 and t4. Notably, DELAY d5 is the residue from a rollover, where d5=d4+e5, but because (d4+e5)>T, T was subtracted in accordance with step 422. Because d5 is redundant with d4, there is no need to trigger d5 with pulse r5. As a result, r5 is dropped corresponding to step 436 of FIG. 3B; however, it should also be noted that DELAY=d5 is maintained for the next pulse adjustment, providing d6=d5+e6. Pulse edge r6 is delayed with d6 to provide a corresponding compensated output pulse p5. For system 10, a comparable process may be provided through appropriate configuration of control logic 42.

Figure 5:
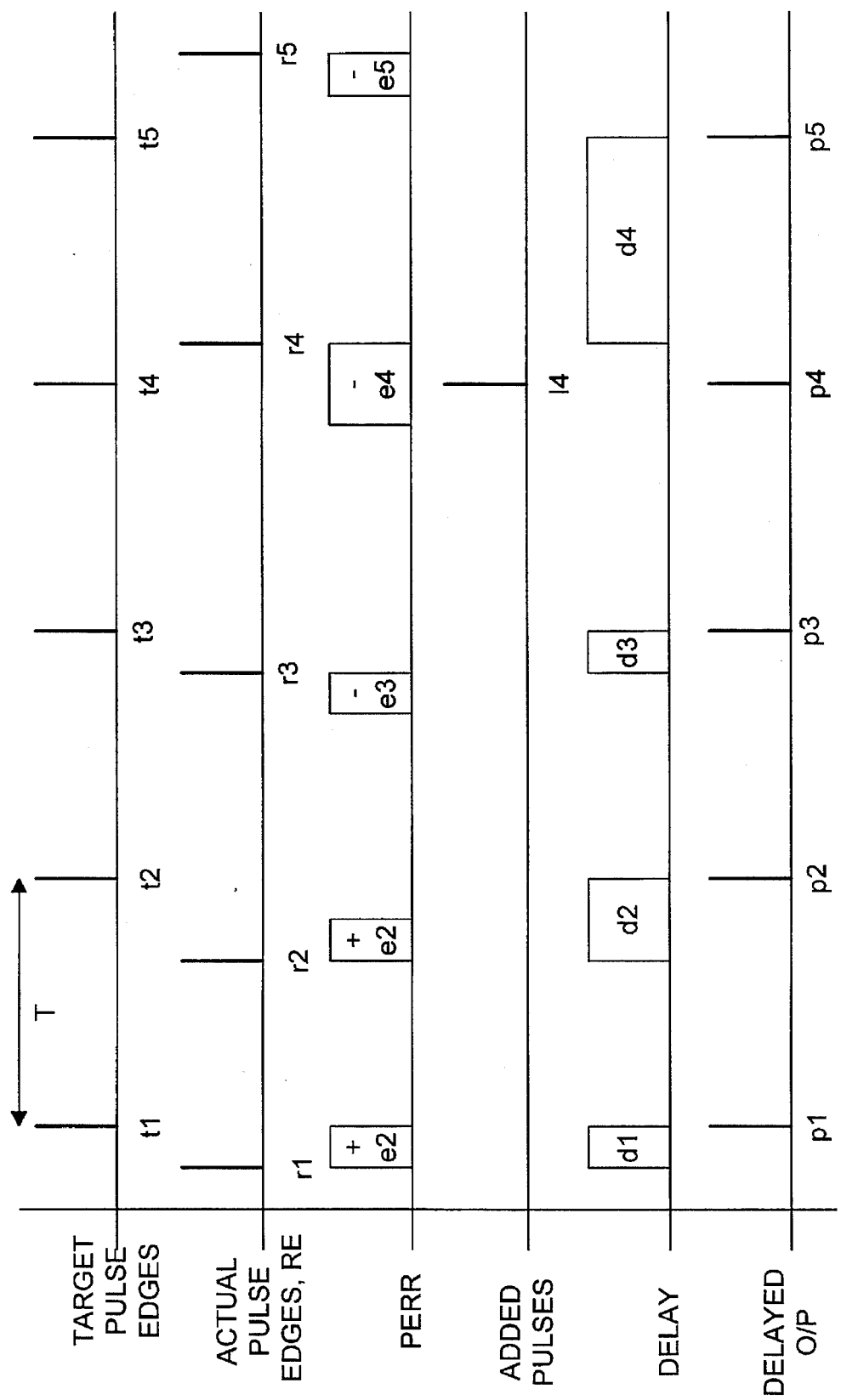
FIG. 5 is a second timing diagram illustrating selected aspects of the routine shown in FIGS. 3A & 3B.

Referring next to FIG. 5, another timing diagram is illustrated. In this diagram, the addition of a similar dynamic accumulation of "positive delay" is shown by d1 through d3, where: d1=e2, d2=d1+e2, and d3=d2+e3. However, because e3 is negative, d3 is less than d2. Furthermore, there is no clock 120 pulse edge available between edges t3 and t4 to trigger a compensation pulse edge p4. As provided in conditional 432 of FIG. 3B, one test for this condition is: (RP-DELAY)≧T. If this condition is true, then the need to insert a pulse is recognized by setting flag APFLG in step 438. This inserted pulse is illustrated as pulse edge I4 which triggers compensation pulse p4 in FIG. 5. In one embodiment, the extra pulses are generated in an interrupt routine utilizing a watchdog timer to insert a pulse after a number of INTCLK 149 pulses corresponding to T have passed. For this embodiment, the watchdog timer may be configured like timer 142 with a corresponding OCR 143 to generate the extra pulse. In other embodiments, the pulse insertion process is integrated directly into the endless loop, or such other process is utilized as would occur to one skilled in the art.

Following step 438, DELAY is calculated in step 440 to provide the appropriate delay d4 to generate the next compensation pulse p5 by properly delaying pulse r4. If APFLG is set and another pulse is detected at conditional 408 before the passage of a quantity of INTCLK 149 pulses corresponding to T, then, as indicated in step 410, the APFLG flag is cleared and the corresponding routine to generate the extra pulse is abandoned. For system 10, this process may also be accomplished in control logic 42.

In an alternative embodiment, clock 20, 120 is selected so that the uncompensated pulse period, including worst-case temperature drift, will not be greater than the target period T for all expected temperatures. In this case, performance within the range of expected temperatures only presents the problem of occasionally dropping pulses corresponding to step 436. This embodiment avoids the need to address the somewhat more complicated situation of inserting a pulse corresponding step 438.

In an embodiment where clock 20, 120 has a square wave output, the routine may be adjusted to provide a "rollover" as a function of ½ T. In this embodiment, if DELAY exceeds ½ T, the routine switches from triggering on leading edges of pulses from clock 20, 120 to trailing edges of clock 20, 120. Similarly, if DELAY again exceeds ½ T, then the routine trigger on the next successive edge, again a leading edge. Similarly, it is recognized that besides pulse edges, the present invention may be adapted to other types and formats of periodic signals.

It should be recognized that not all paths to step 440 may require the same number of operational cycles. As a result, OPC is adjusted in alternative paths of the compensation loop in steps 336 and 338. Upon completion of step 440, the loop starts again via connector 442 at conditional 408.

In one alternative embodiment, the loading of OCR 143 with CP in step 440 is performed upon entry into an interrupt routine triggered by each RE from clock 120. In this case, the loading of OCR 143 is performed in such a way that a variable like OPC, with attendant adjustments depending on the execution path, is not needed. Similarly, in other embodiments, the steps and conditionals of routine 400 may be reordered, combined, deleted, or substituted as would occur to one skilled in the art. Furthermore, it should be recognized that signals within station 10, 110 generally correspond to the variables, steps, and conditionals described in connection therewith.

Elements 42, 44, 46, 48, 52, 62 of system 10 are preferably a hard-wired state machine system; however, substitution of appropriate analog devices is also envisioned. Similarly, controller 140 of system 110 may be regarded as a collection of one or more components corresponding to each of the various designated elements 141, 142, 143, 144, 145, 145a, 145b, 146, 147, 148, and 162. Furthermore, these components may be combined or deleted and added or substituted with various other components without departing from the spirit of the present invention. However, it is preferred that controller 140 be of a programmable microcontroller variety such as the 68HC11E9 microcontroller available from Motorola, Inc., 1301 East Algonquin Road, Schaumburg, Ill. The 68HC11E9 is described in a technical manual published by Motorola, Inc. entitled: "HC11 M68HC11 E Series Technical Data."

In an embodiment particularly suited for providing an accurate time source over a long period of time, such as a day/month/year clock, a compensated output of 1 Hz with about 1 ppm is provided. For this embodiment, the frequency of clock 120 is about 1 Hz with 50 ppm error and the frequency of INTCLK 149 is about 2 MHz with 50 ppm error. This embodiment also has a sleep mode, whereby controller 140 is powered down to a standby state between pulses to reduce energy consumption. Upon receiving a pulse from clock 120, controller 140 "wakes up" to provide processing needed for that pulse and then returns to the sleep state, only needing to maintain pertinent variables in a low power static RAM. Generally, this sleep mode feature conserves energy needed to drive outputs like the output of OCR 143. One particular application of this embodiment is in a device which is intermittently powered by a battery.

All publications, patents, and patent applications cited, discussed, or listed in this specification are hereby incorporated by reference as if each individual publication, patent, or patent application were specifically and individually indicated to be incorporated by reference and set forth in its entirety herein.

While the invention has been illustrated and described in detail in the drawings and foregoing discussion, the same is to considered illustrative and not restrictive in character, it being understood that only the preferred embodiment has been shown and described and that all changes and modifications that come within the spirit of the invention are desired to be protected.

What is claimed is:

1. A temperature compensation system, comprising:
   a first oscillator configured to generate a number of pulses, said first number of pulses varying from a desired frequency as a function of temperature of said first oscillator;
   a second oscillator configured to generate digital pulses at a corrective frequency, said corrective frequency being at least 100,000 times greater than said desired frequency;
   a temperature sensor configured to provide an analog temperature signal corresponding to temperature of said first oscillator;
   an analog to digital converter coupled to said sensor to correspondingly convert said temperature signal to a digital temperature error address signal for each of said number of pulses;
   a digital memory coupled to said converter, said memory including a digital error table addressable by said temperature error address signal to provide a number of digital pulse error signals corresponding to temperature error for each of said number of pulses, each of said number of pulse error signals being a function of said corrective frequency and a temperature versus frequency characteristic of said first oscillator;
   a digital accumulator coupled to said memory, said accumulator being configured to receive each of said pulse error signals to provide a digital cumulative error signal corresponding to one of said number of pulses; and
   a variable digital delay device coupled to said accumulator, said first oscillator, and said second oscillator, said delay device being configured to count a quantity of corrective pulses from said second oscillator in response to said one of said number of pulses to provide a delayed output pulse in accordance with said desired frequency, said quantity of corrective pulses being a function of said cumulative error signal provided by said accumulator.

2. The system of claim 1, wherein said converter, said memory, said accumulator, and said delay device are embedded in a programmable microcontroller.

3. A method of temperature compensation, comprising:
   (a) providing a temperature compensated digital clock having a first digital frequency source with a first output at a first frequency and a second digital frequency source with a second frequency greater than the first frequency;
   (b) empirically determining a temperature versus frequency characteristic for the first frequency source as a function of the second frequency;
   (c) determining a deviation of the first frequency from a target frequency with the temperature versus frequency characteristic by sensing temperature of the first frequency source; and
   (d) generating a compensated output signal at the target frequency by delaying the first output by an amount of time corresponding to the deviation.

4. The method of claim 3, wherein said empirically determining includes:
   (b1) exposing the clock to a generally constant selected temperature;
   (b2) measuring a deviation of the first frequency source from a target frequency at the selected temperature; and
   (b3) recording the deviation.

5. The method of claim 4, wherein said empirically determining further includes repeating (b1) through (b3) for each of a number of selected temperatures.

6. The method of claim 3, wherein the digital clock includes:
   a temperature sensor for sensing temperature of the first frequency source;
   an analog to digital converter coupled to the sensor;
   an electronic memory coupled to the converter, the memory including values corresponding to the temperature versus frequency characteristic;
   an accumulator for determining the amount of time corresponding to the deviation as a function of the second frequency; and
   a variable delay device coupled to the accumulator, the delay device being configured to provide the compensated output signal.

7. A temperature compensation system, comprising:
   a first frequency source configured to provide a first digital output with a first frequency;

a sensor configured to provide a temperature signal corresponding to temperature of said first frequency source, said temperature signal being configured to determine a deviation of said first frequency corresponding to temperature drift of said first frequency source from a target frequency; and a variable delay device responsive to said temperature signal, said delay device being configured to delay said first output for a duration as a function of said deviation to provide a compensated output signal at said target frequency.

8. The system of claim 7, wherein said deviation is determined as a function of a second frequency greater than said first frequency.

9. The system of claim 8, wherein said second frequency is at least 10,000 times greater than said first frequency.

10. The system of claim 7, wherein said variable delay device is embedded in a controller coupled to said first frequency source and said sensor, said controller being configured to provide a deviation signal corresponding to said deviation.

11. The system of claim 10, wherein said controller includes an electronic memory storing a temperature versus frequency characteristic for said first frequency source.

12. The system of claim 11, wherein said controller further includes an analog to digital converter coupled to said sensor and an accumulator coupled to said memory to determine said duration.

13. The system of claim 12, wherein said temperature versus frequency characteristic is determined as a function of a second frequency at least 10,000 times greater than said first frequency.

14. The system of claim 7, further comprising a second frequency source providing a second digital output at said second frequency.

15. The system of claim 14, wherein said variable delay device is coupled to said second frequency source and is triggered by said first frequency source to determine said duration as a function of a number of pulses from said second frequency source.

16. A method of temperature compensation, comprising:

(a) sensing temperature of a first frequency source having a first digital output at a first frequency;

(b) determining a deviation of the first frequency from a target frequency in accordance with sensed temperature; and (c) generating a compensated digital output signal at the target frequency by delaying the first output by an amount of time corresponding to the deviation.

17. The method of claim 16, wherein the deviation is determined as a function of a second frequency at least 10,000 times greater than the first frequency.

18. The method of claim 16, wherein said generating includes identifying a pulse of the first frequency source to drop.

19. The method of claim 16, wherein said generating includes identifying a pulse of the first frequency source to add.

20. The method of claim 16, wherein said generating includes triggering the amount with a pulse edge from the first digital output.

21. A method temperature compensation, comprising:

(a) sensing temperature of a first frequency source having a first digital output at a first frequency;

(b) determining a temperature drift deviation of the first frequency from a target frequency as a function of a second frequency and sensed temperature, the second frequency being greater than the first frequency; and (c) generating a digitally compensated output signal at the target frequency by delaying the first digital output by a duration as a function of the deviation.

22. The method of claim 21, wherein the second frequency is at least 10,000 times greater than the first frequency.

23. The method of claim 21, wherein the second frequency is at least 100,000 times greater than the first frequency.

24. The method of claim 21, wherein the second frequency is at least 1,000,000 times greater than the first frequency.

25. The method of claim 21, wherein the second frequency is at least 10,000 times the first frequency, the first frequency source is coupled to a controller configured to provide a deviation signal corresponding to the deviation, and the controller is coupled to a second frequency source configured to provide the second frequency, and the controller has a sleep mode periodically activated between pulses from the first frequency source.

26. The method of claim 21, wherein said sensing is performed with a temperature sensor, and said determining and said generating are performed with:

an analog to digital converter coupled to the sensor;

an electronic memory coupled to the converter, the memory including values corresponding to a temperature versus frequency characteristic for the first frequency source;

an accumulator for determining the amount of time corresponding to the deviation as a function of the second frequency; and a variable delay device coupled to the accumulator, the delay device being configured to provide the compensated output signal.

27. The method of claim 26, wherein the converter, the memory, the accumulator, and the delay device are defined within a controller.

* * * * *

UNITED STATES PATENT AND TRADEMARK OFFICE
CERTIFICATE OF CORRECTION

PATENT NO. : 5,644,271
DATED : July 1, 1997
INVENTOR(S) : Ivan Peter Mollov

It is certified that error appears in the above-indentified patent and that said Letters Patent is hereby corrected as shown below:

In Col. 2, line 44, please change "now" to --flow--

In Col. 3, line 30, please change "freqeuncy" to --frequency--

In Col. 5, line 29, please change "The" to --the--

In Col. 6, line 52, please add a period after "illustrated"

In Col. 7, line 21, please delete the period after "frequency"

In Col. 7, line 35, please change "invenition" to --invention--

In Col. 8, line 41, please change "insertng" to --inserting--

Signed and Sealed this

Eleventh Day of November, 1997

Attest:

BRUCE LEHMAN

Attesting Officer

Commissioner of Patents and Trademarks